(12) United States Patent
Shepard, III

(10) Patent No.: US 6,567,942 B1
(45) Date of Patent: May 20, 2003

(54) METHOD AND APPARATUS TO REDUCE THE SIZE OF PROGRAMMABLE ARRAY BUILT-IN SELF-TEST ENGINES

(75) Inventor: Philip George Shepard, III, Round Rock, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/435,874

(22) Filed: Nov. 8, 1999

(51) Int. Cl.[7] .............................................. G01R 31/28
(52) U.S. Cl. ........................ 714/726; 714/733; 714/734
(58) Field of Search ................................ 714/733, 734, 714/726, 724, 735, 736, 738, 739, 742, 30, 31, 32, 33; 365/200, 201

(56) References Cited

U.S. PATENT DOCUMENTS

| | | | | |
|---|---|---|---|---|
| 4,835,774 A | * | 5/1989 | Ooshima et al. | ............. 714/719 |
| 5,577,050 A | * | 11/1996 | Bair et al. | .................. 365/201 |
| 5,633,877 A | | 5/1997 | Shephard, III et al. | .... 371/22.2 |
| 5,796,745 A | * | 8/1998 | Adams et al. | ................ 714/30 |

* cited by examiner

Primary Examiner—Christine T. Tu
(74) Attorney, Agent, or Firm—Duke W. Yee; Casimer K. Salys; Stephen J. Walder, Jr.

(57) ABSTRACT

A programmable array built-in self test system for testing an embedded array allows self test functions, e.g. test patterns, read/write access, and test sequences, to be modified without hardware changes to the test logic. Prior programmable ABIST systems have three types of control structure: scan only mode control bits; direct use of bits from the microcode instruction; and state machines that are controlled by microcode instructions which may then be used to provide feedback to the branch control functions that control the microcode instruction pointer. A fourth type of control structure is disclosed that can be used to reduce the number and/or size of the microcode instructions that are required to implement many array test algorithms. This fourth type of control structure is used to modify the values that are generated by the original three array control structure types. This mechanism is implemented as a the test mode register. Two other improvements are made to control the looping mechanism. The first improvement is the addition of a function which allows the branch pointer to be updated to point to the current instruction, thereby enabling branches to multiple places in the ABIST instruction set. The second improvement is the addition of test mode compare latches and the test mode comparitor which allow branches to be taken based on the state of the test mode register.

25 Claims, 5 Drawing Sheets

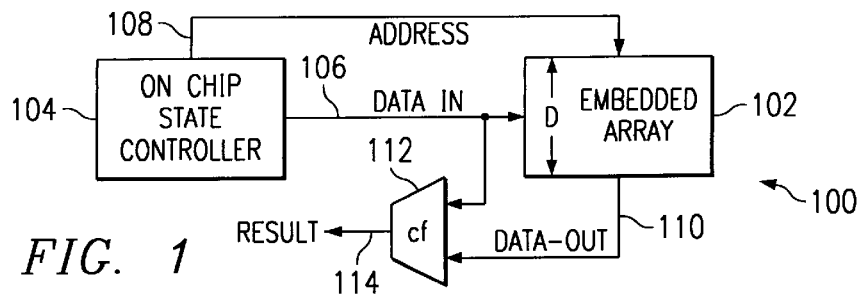

FIG. 1

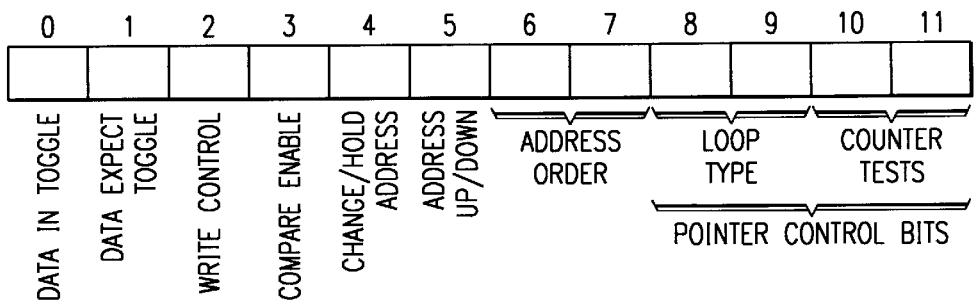

| BIT(S) | NAME | SETTING |
|---|---|---|
| 0 | DATA IN TOGGLE | 1=FLIP/0=HOLD DATA INPUT VALUE |
| 1 | DATA EXPECT TOGGLE | 1=FLIP/0=HOLD DATA EXPECT VALUE |
| 2 | WRITE CONTROL | 1=WRITE/0=NOT WRITE |
| 3 | COMPARE ENABLE | 1=ENABLE COMPARE/0=DISABLE COMPARE |
| 4 | CHANGE/HOLD ADDRESS | 1=CHANGE ADDRESS/0=HOLD ADDRESS |
| 5 | ADDRESS UP/DOWN | 1=DECREMENT ADDRESS/0=INCREMENT ADDRESS |
| 6-7 | ADDRESS ORDER | 00=BITLINE, WORDLINE, SUBARRAY<br>01=WORDLINE, SUBARRAY, BITLINE<br>10=SUBARRAY, BITLINE, WORDLINE<br>11=UNUSED |
| 8-9 | POINTER CONTROL- LOOP TYPE | UPDATE INSTRUCTION POINTER TO THE FOLLOWING UNLESS BOTH POINTER CONTROL TESTS (BITS 10-11) ARE SATISFIED:<br>00=SAME INSTRUCTION<br>01=INSTRUCTION 0<br>10=PREVOIUS INSTRUCTION<br>11=INSTRUCTION POINTED TO BY BR |
| 10-11 | POINTER CONTROL- COUNTER TEST | 00=ALWAYS<br>01=ADDRESS OVERFLOW=1<br>10=DATE INPUT VALUE=0<br>11=DATA INPUT VALUE=1 |

FIG. 3
(PRIOR ART)

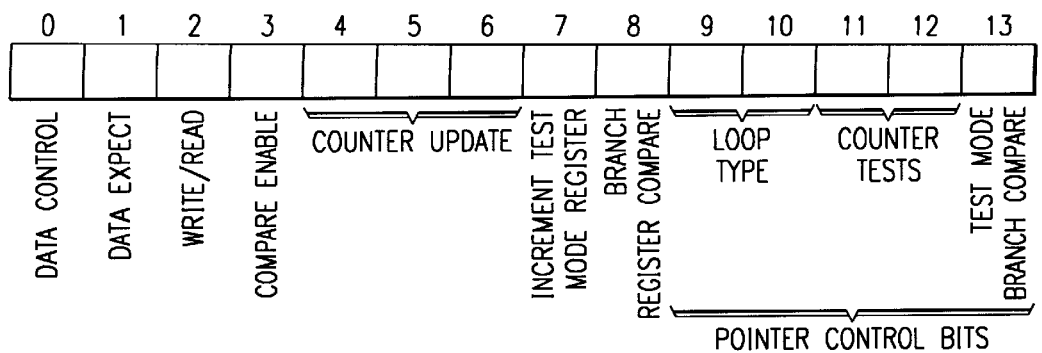

| BIT(S) | NAME | SETTING |
|---|---|---|
| 0 | DATA IN TOGGLE | 1=FLIP/0=HOLD DATA INPUT VALUE |
| 1 | DATA EXPECT TOGGLE | 1=FLIP/0=HOLD DATA EXPECT VALUE |
| 2 | WRITE CONTROL | 1=WRITE/0=NOT WRITE |
| 3 | COMPARE ENABLE | 1=ENABLE COMPARE/0=DISABLE COMPARE |
| 4-6 | COUNTER UPDATE | 000=HOLD PATTERN COUNTER, AND ADDRESS COUNTERS<br>001=INCREMENT ADDRESS COUNTERS<br>010=INCREMENT READ ADDRESS COUNTER<br>011=INCREMENT WROTE ADDRESS COUNTER<br>100=DECREMENT PATTERN COUNTER (RELOADS WHEN ALL 0'S)<br>101=IF PATTERN COUNTER=ALL 0'S, INCREMENT ADDRESS COUNTERS, AND DECREMENT PATTERN COUNTER<br>110=IF PATTERN COUNTER=ALL 0'S, INCREMENT READ ADDRESS COUNTER, AND DECREMENT PATTERN COUNTER<br>111=IF PATTERN COUNTER=ALL 0'S, INCREMENT ADDRESS COUNTERS, AND DECREMENT PATTERN COUNTER |
| 7 | INCREMENT TEST MODE REGISTER | 1=CHANGE ADDRESS MODE (TEST MODE REG)/<br>0=HOLD TEST MODE REG |
| 8 | BRANCH REGISTER (BR) CONTROL | 1=SET BR TO CURRENT INSTRUCTION/0=HOLD BR |
| 9-10 | POINTER CONTROL-LOOP TYPE | UPDATE INSTRUCTION POINTER TO THE FOLLOWING UNLESS BOTH POINTER CONTROL TESTS (BITS 11-12 AND 13) ARE SATISFIED:<br>00=SAME INSTRUCTION<br>01=INSTRUCTION 0<br>10=PREVIOUS INSTRUCTION<br>11=INSTRUCTION POINTED TO BY BR |
| 11-12 | POINTER CONTROL-COUNTER TESTS | 00=ALWAYS<br>01=ADDRESS OVERFLOW=1<br>10=PATTERN COUNTER=0<br>11=ADDRESS OVERFLOW=1, AND PATTERN COUNTER=0 |
| 13 | POINTER CONTROL-TEST MODE BRANCH COMPARE | 1=TEST MODE COMPARE IS TRUE/0=ALWAYS |

*FIG. 4*

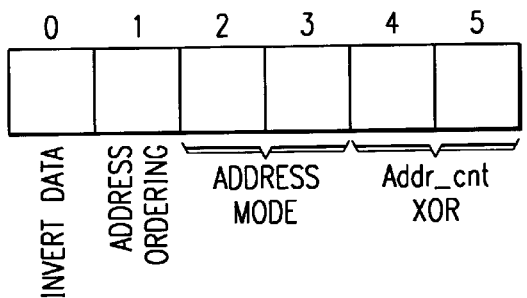

TMR COUNTER BEHAVIOR

BIT 0 CHANGES FASTEST
BITS 2-3 IS SKIPPED BY "CHANGE addr_mode" OPERATION WHEN=11
BITS 4-5 IS SKIPPED BY "CHANGE addr_mode" OPERATION WHEN=11

| BIT(S) | NAME | SETTING |
|---|---|---|
| 0 | INVERT DATA | |
| 1 | ADDRESS ORDERING | ADDRESS COUNTERS DIRECTION. 1=COUNT UP/0=COUNT DOWN |
| 2-3 | ADDRESS MODE | 00=WBS<br>01=BSW<br>10=SWB<br>11=UNUSED |
| 4-5 | Addr_cnt XOR | WRITE ADDRESS COUNTER BITS TO XOR<br>WITH DATA INPUT AND DATA EXPECT VALUES<br>(IF SATISFIED INVERTS DATA INPUT AND DATA EXPECT VALUES)<br>00=NONE<br>01=LEAST SIGNIFICANT BIT (LSB) FOR THIS ADDRESS MODE<br>10=WORD LINE LSB XOR BIT LINE LSB<br>11=UNUSED |

FIG. 5

TEST MODE COMPARE LATCHES

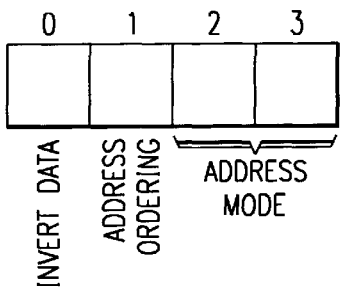

ALL BITS MUST MATCH FOR COMPARE TO BE TRUE

| BIT(S) | NAME |
|---|---|
| 0 | INVERT DATA |
| 1 | ADDRESS ORDERING |
| 2-3 | ADDRESS MODE |

*FIG. 6*

MICROCODE ALGORITHM

| MICROCODE INSTRUCTION | MEANING |
|---|---|
| 00100010000010 | WRITE TILL ADDRESS CARRYOUT |
| 11000000100000 | INVERT DATA-IN AND DATA-EXPECT VALUES, SET BRANCH POINTER TO CURRENT INSTRUCTION |
| 01010000000000 | READ, THEN INVERT DATA-EXPECT VALUE |
| 01110010011010 | WRITE AND READ THEN, INVERT DATA-EXPECT VALUE, INCREMENT ADDRESS, DECREMENT INSTRUCTION POINTER. IF ADDRESS OVERFLOW THEN GO TO BRANCH POINTER |
| 11000000100000 | INVERT DATA-IN AND DATA-EXPECT VALUES, SET BRANCH POINTER TO CURRENT INSTRUCTION |
| 01110000000000 | WRITE AND READ, THEN INVERT DATA-EXPECT VALUE |
| 01010010011010 | READ THEN, INVERT DATA-EXPECT VALUE, INCREMENT ADDRESS, DECREMENT INSTRUCTION POINTER. IF ADDRESS OVERFLOW THEN GO TO BRANCH POINTER |
| 00000001001001 | GO TO INSTRUCTION 0 TILL TMR IS AT END OF TEST, AND UPDATE TMR |

*FIG. 7*

METHOD AND APPARATUS TO REDUCE THE SIZE OF PROGRAMMABLE ARRAY BUILT-IN SELF-TEST ENGINES

CROSS-REFERENCE TO RELATED APPLICATIONS

The present invention is related to the following applications entitled Programmable Array Built-In Self-Test Method and Controller with Full Programmable Expect Generator, U.S. application Ser. No. 09/435,875, filed on Nov. 8, 1999, which is incorporated herein by reference.

TECHNICAL FIELD

The present invention relates generally to an improved data processing system and in particular to a method and an apparatus for building self-test code on-chip for an array structure. Still more particularly, the present invention provides a method to enhance the functionality of the instruction array used to implement the testing algorithms.

DESCRIPTION OF THE RELATED ART

In general, integrated circuit arrays are tested by providing a known data input at a known address to the array and comparing the output of the array to the expected output. One well-known and widely used prior art system for testing integrated circuit logic is called Array Built-In Self Test (ABIST) technology. ABIST allows high speed testing of the array without having a large number of input/output connections to the chip itself. Key ingredients to this approach are to provide high speed testing and to confine the test system to a minimum area of the chip. In prior art systems, test patterns have generally been limited to a well-known set including all 0's, all 1's, checkerboard, checkerboard complement, and pseudo-random. These prior art systems permit very limited looping and addressing controls.

U.S. Pat. No. 5,633,877 to Shephard et al, issued May 27, 1997, provides a programmable ABIST function for VLSI logic or memory modules. This circuitry provided the provision of an array built-in self test system which allows self test functions (e.g. test patterns, read/write access, and test sequences) to be modified without hardware changes to the test logic. The test sequence is controlled by scanned logical test vectors (instructions), which can be changed, making the task of developing complex testing sequences relatively easy.

However, it is advantageous to be able to implement more complex ABIST algorithms in fewer programmable ABIST instructions thereby reducing the number of ABIST engine initializations and/or the depth of the ABIST instruction array, with only modest increases in circuit components on the chip.

SUMMARY OF THE INVENTION

A programmable array built-in self test system for testing an embedded array allows self test functions, e.g. test patterns, read/write access, and test sequences, to be modified without hardware changes to the test logic. Prior programmable ABIST systems have three types of control structure: scan only mode control bits; direct use of bits from the microcode instruction; and state machines that are controlled by microcode instructions which may then be used to provide feedback to the branch control functions that control the microcode instruction pointer.

The present invention discloses a fourth type of control structure that can be used to reduce the number and/or size of the microcode instructions that are required to implement many array test algorithms. This fourth type of control structure is used to modify the values that are generated by the original three array control structure types. This fourth control mechanism is implemented as a the test mode register in the preferred embodiment of this invention.

Two other improvements are made to control the looping mechanism. The first is the addition of a function which allows the branch pointer to be updated to point to the current instruction, thereby enabling branches to multiple places in the ABIST instruction set.

The second improvement is the addition of test mode compare latches and the test mode comparator which allow branches to be taken based on the state of the test mode register.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 is a block diagram showing the major components in accordance with a preferred embodiment of the present invention;

FIG. 3 shows a modified microcode instruction from the prior art;

FIG. 4 shows the functions of the microcode instruction in accordance with a preferred embodiment of the present invention;

FIG. 5 shows the functions of the test mode compare latches in accordance with a preferred embodiment of the present invention;

FIG. 6 shows the functions of the test mode register in accordance with a preferred embodiment of the present invention; and FIG. 7 shows a test program illustrating the new features of the ABIST engine in accordance with a preferred embodiment of the present invention.

DETAILED DESCRIPTION OF THE PREFERRED EMBODIMENT

Figure 2:
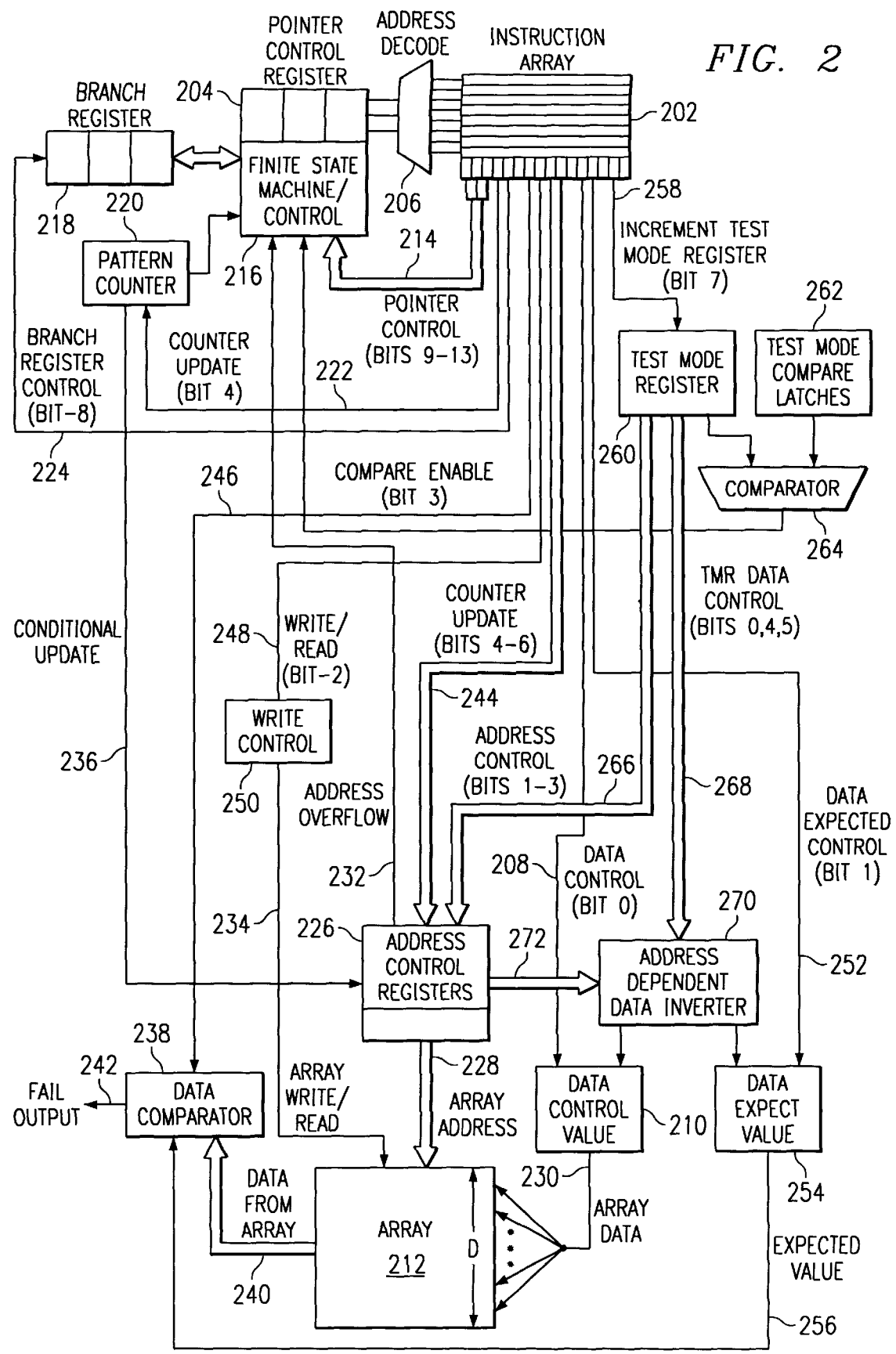
FIG. 2 is a detailed diagram showing the components for an ABIST in accordance with a preferred embodiment of the present invention.

An object of this invention is to expand the programmability of an ABIST system for testing arrays, particularly arrays embedded within dense VLSI logic chips; a system that can generate new test patterns and new test sequences without requiring hardware changes to the controller or to the test system. In particular, there is a need for more complex looping conditions during the tests and the ability to generate a wider variety of test patterns. This all has to be accomplished with only a small increase in circuit components on the chip.

One approach to solve this problem would be to increase the depth of the instruction array so that more instructions can be stored for the test programs. However this relatively simple solution has several drawbacks. It uses too much "chip real estate" and it does not allow some of the complex looping conditions required by more extensive testing algorithms.

Another approach is to modularize the test programs and scan in each smaller program one after the other. This requires no additional chip real estate and simply uses the ABIST mechanism already in place. This has the disadvantages of making the testing process more complex and time consuming and it also does not allow some of the complex looping conditions required by more sophisticated testing algorithms.

The instruction array to implement the algorithms used in this example using the prior art is 12 bits wide and 8 instructions deep. Since doubling or tripling the number of instructions by increasing the depth does not solve the fundamental problem of implementing more complex test algorithms, the approach of this invention is to increase the width of the instruction array from 12 bits to 14 bits and to use the additional bits in the microcode to control a test mode register and branch counter update that will provide the increased functionality.

Briefly, the present invention contemplates the provision of an array built-in self test system which allows self test functions (e.g. test patterns, read/write access, and test sequences) to be modified without hardware changes to the test logic. In one embodiment, the test sequence is controlled by scanned logical test vectors (instructions), which can be changed, making the task of developing complex testing sequences relatively easy.

The depicted embodiment of the system is implemented as a VLSI integrated circuit, with scannable, programmable memory elements for use in generating test data patterns and test operational sequences, including:

- a write control register coupled to an accompanying state machine,
- a data input register coupled to an accompanying state machine,
- a data output register with data compression capability or failing address capture capability, coupled to an accompanying state machine,
- an array address control register with accompanying state machine,
- a microcode pointer control register with accompanying state machine,
- a branch pointer with accompanying update function,
- a instruction array which provides a program sequence means for accomplishing testing of the embedded array by manipulating the various state machines, and
- a test mode register which enhances the functionality of the instruction array.

The original programmable ABIST engine described in U.S. Pat. No. 5,633,877 contained three types of control structure: scan only mode control bits; direct use of bits from the microcode instruction; and state machines that are controlled by microcode instructions which may then be used to provide feedback to the branch control functions that control the microcode instruction pointer.

The present invention discloses a fourth type of control structure that can be used to reduce the number and/or size of the microcode instructions that are required to implement many array test algorithms. This fourth type of control structure is used to modify the values that are generated by the original three array control structure types. It also discloses two other mechanisms that can be used to reduce the number of microcode instructions that are required to implement some array test algorithms.

In the example implementation, the fourth type of control structure is implemented as a Test Mode Register (TMR) that can modify the values that are generated by other array control structures. This control structure can then be used to implement the most commonly used stimulus changes performed in the "outer loops" of many ABIST algorithms, thereby allowing the selective modification of several different control signals with a single microcode instruction.

The other mechanism that is disclosed herein is the update branch pointer function which is controlled by a bit in the microcode instruction being executed; when set this bit causes the branch pointer to be updated to point to the current instruction. This allows multiple loops with different starting points to be defined in the ABIST microcode without the need to have multiple branch registers.

Test functions include, but are not limited to, the following examples.

Array data in value control
Array address controls: count/hold
Array address controls: count by incrementing or decrementing
Array address controls: address subfield reordering
Array write enable control
Data out expect value
Compare masking
Instruction pointer controls and tests These functions may be better understood by referring to FIG. 3 below, U.S. Pat. No. 5,633,877, and Patent disclosure AT9-99-776.

The test data patterns, array address controls, array write controls, and the test mode register are initialized via scanning. The microcode pointer control register controls the various test state machines via the logical test vectors to enable "at speed" functional testing of the array. Test results are gathered by observing an ABIST failout signal either at a chip pin, and/or via scanning. Subsequent test scenarios can also scanned in. Failures can also be monitored on the fly in certain cases.

Referring now to FIG. 1 of the drawings, region 100 of an integrated circuit chip has formed therein embedded array 102, which is D bits wide. Also formed in region 100, in close proximity to array 102, is an array built-in self-test system, which includes programmable state controller 104. The programmable state controller 104 generates a sequence of data pattern inputs 106, address inputs 108, and read and write controls to array 102. The data pattern is written into array 102 and then read out as data outputs 110. Logic 112 compares the data output of the array with the expected data output pattern and provides result 114 which might be, for example, pass/fail output indication as described in Disclosure AT9-99-776, and failed address function that identifies the address at which an error occurred.

With reference now to FIG. 2, a diagram of an ABIST engine with an embedded array is depicted in accordance with the preferred embodiment of the present invention. This figure illustrates a programmable ABIST engine, such as ABIST engine 104 and embedded array 102 in FIG. 1.

In this example, an instruction array 202 along with pointer control register 204 form a programmable state sequencer. Address decoder 206 couples pointer control register 204 to instruction array 202. During each cycle, one instruction register within instruction array 202 may be selected by pointer control register 204 and the contents of the register being read out and being used to determine the action being taken. In these examples, the actions may include, for example, sending signals to other test elements and/or altering the contents of pointer control register 204. For example, the alteration to pointer control register 204 may be to increment the pointer, decrement the pointer, hold the current pointer value, reset the pointer to zero, or change the pointer to the value contained in a branch register. Instructions within instruction array 202 will be explained in more detail in FIG. 3 below.

Bus 208 couples data control bit 0 of a register selected by the pointer in pointer control register 204 to a data control value 210. Bus 214 couples instruction array 202 to finite state control logic 216, which loads pointer control register 204 with an address specified by the pointer control field. Bus 214 comprises bit 9 through bit 13 in the microcode instruction. Alternatively, finite state control logic 216 may load the contents of branch register 218 into pointer control register 204 when the pointer control field specifies a branch on a register operation. Bus 224 couples branch register control bit 8 of the micro-code instruction which when active causes the contents of the address pointer register in 204 to be loaded into branch register 218.

Pattern counter 220 is coupled to state control logic 216 to control repetition of microcode instructions. Bus 236 couples a conditional update signal from pattern counter 220 to address control registers 226. Bus 222 couples counter update bit 5 of a register selected by the pointer in pointer control register 204 to pattern counter 220.

Buses 228 and 230 respectively couple the output of address control register 226 and data control value 210 to array 212. Bus 232 couples the address overflow state of address control register 226 to state control logic 216. Bus 240 couples data read out of array 212 to a-suitable data comparator 238 in which the data is compared with data on bus 256 read from data expect value 254. Bus 252 transfers data expect control bit 1 from instruction array 202 to data expect value 254. Data comparator 238 is used to produce fail output indication 242 of whether the test passed or failed in this example. Bus 244 couples the counter update bits 4, 5, and 6 from instruction array 202 to address control register 226. Bus 246 couples the one bit compare enable function control signal from instruction array 202 to enable or disable data comparator 238. Bus 248 couples instruction array 202 to write control register 250 and sends the write control bit into write control register 250. Bus 234 couples array write control signal from write control register 250 to array 212 in this example.

Bus 258 couples the increment test mode register bit 7 from instruction array 202 to test mode register 260. Test mode compare latches 262 have their values set by scanning when the microcode is input to instruction array 202. The outputs of test mode register 260 and the test mode compare latches 262 are sent to comparator 264. The output of comparator 264 is feed back to finite state machine 204 for use in controlling the instruction address pointer.

Test mode register bits 1–3 comprise the address control bits sent by bus 266 from test mode register (TMR) 260 to address control registers 226. Test mode register bits 0,4,5 comprise the TMR data control bits sent by bus 268 from test mode register 260 to address dependent data inverter 270. Bus 272 transfers a subset of array address bits from address control registers 226 to address dependent data inverter 270. Address dependent data inverter 220 sends a one bit control signal to data control value 210 and sends a one bit control signal to data expect value 254.

More information on the details of the registers and operation of the ABIST engine may be found in the U.S. Pat. No. 5,633,877, which is incorporated herein by reference, and in Disclosure AT9-99-776.

FIG. 3 contains the 12 bit microcode instruction set that could be used to test the array configuration used in this example implementation using the techniques described in the prior Shephard U.S. Pat. No. 5,633,877. The nine bit microcode instruction of the earlier patent has been extended to 12 bits, as shown in the table of FIG. 3.

Of particular significance are the three orderings possible for testing: WBS, BSW, and SWB, where W is the word line, B is the bit column, and S is the subarray. The different address orders are needed for the different array testing algorithms that are required for arrays with interleaved columns. In BSW mode, consecutive test patterns can select between cells that are adjacent in the bit direction, while in WBS mode consecutive patterns can operate on cells that are adjacent in the word line direction. In SWB mode consecutive patterns can operate on different subarrays to test the logic that selects between them.

With reference now to FIG. 4, the fourteen-bit microcode instruction is described in accordance with a preferred embodiment of the present invention. These microcode instructions are the eight words in instruction array 202 in FIG. 2. The table provides a detailed summary of the functions for all of the bits. Comparing FIG. 3 and FIG. 4 we see that the size of the instruction grew by two bits. This small increase in size makes it possible to execute complex test algorithms within the 8 instruction limit that would have taken up to two or three times as many instructions using the microcode instruction set shown in FIG. 3.

With reference now to FIG. 5, the six-bit test mode register is described in accordance with a preferred embodiment of the present invention. The table provides a detailed summary of the functions for all of the bits. Bits 0, 4, and 5 are used to invert the data values to create a wider range of data patterns. Bits 1, 2, and 3 control the address ordering and the address up/down setting. These bits are compared with the settings of the test mode compare latches shown in FIG. 6 below and the result of this comparison is sent to the finite state machine to be used in the pointer control branch testing function.

With reference now to FIG. 6, the four-bit test mode compare latches are described in accordance with a preferred embodiment of the present invention. The table provides a detailed summary of the functions for all of the bits With reference now to FIG. 7, a program is presented in accordance with a preferred embodiment of the present invention. The instruction array can store up to eight microcode instructions, each instruction containing fourteen bits, as described in FIG. 4. The table presents these eight 14-bit instructions and an explanation of the instruction.

The version of the test program shown in FIG. 7 uses the updateable branch pointer that is introduced as part of this invention. Notice that the algorithm takes exactly eight instructions. This program uses both the test mode register and the three address orders implemented as part of this invention. In particular, incrementing the test mode register and the test address order appear in instruction 8. In the preferred embodiment of the invention, this program requires eight instructions. In the prior art this program could not be implemented within the eight instruction limit. To handle all three address orders would require replicating the logic of the algorithm three times resulting in a tripling of the code depth.

This program also uses the branch pointer update function. The branch pointer is updated in instruction 1, and again in instruction 4. This ABIST programming sequence would have to be run in two parts regardless of the code depth if the branch pointer update function was not present.

The description of the present invention has been presented for purposes of illustration and description, but is not limited to be exhaustive or limited to the invention in the form disclosed. Many modifications and variations will be apparent to those of ordinary skill in the art. The embodiment was chosen and described in order to best explain the principles of the invention the practical application and to enable others of ordinary skill in the art to understand the invention for various embodiments with various modifications as are suited to the particular use contemplated.

What is claimed is:

1. A built-in, on-chip system for testing an embedded array having data input ports, data output ports, and address ports, the system comprising in combination:
   a data control value element used for generating and applying deterministic data patterns to the data input ports of the embedded array;
   an address control register for generating addresses for application to the embedded array in coordination with the data control value element;
   a data expect value element used for generating a pattern of data expected at the output ports;
   a comparator for comparison of data output from the data expect value element with data output from the data output ports of the embedded array;
   an instruction array for storing a plurality of microcode instructions, each instruction including a data control value field, an address control register field, an address mode field, a microcode pointer control register field, a write enable control field, an increment test mode register field, a branch register control field, a pattern counter update field, and a data expect control field;
   test mode logic for generating signals to control addressing modes based on a value of the increment test mode register field;
   a finite state machine for controlling the address control register, the data control value element, and a microcode pointer control register in response to the plurality of microcode instructions, an overflow feedback state of the address control register, and an output of the test mode logic; and
   an address dependent data inverter that allows data bits of at least one of the data control value element and the data expect value element to be inverted based on a current address value obtained from the address control register.

2. The built-in, on-chip system according to claim 1, wherein the address dependency data inverter generates and modifies data patterns by inverting the data bits of at least one of the data control value element and the data expect value element based on the current address value.

3. The built-in, on-chip system according to claim 1, wherein the microcode instructions of the instruction array provide a test sequence for testing the embedded array, and wherein the test sequence includes data as to which addresses to test, which data pattern to use, and whether and when to read or write and wherein the test sequence is modifiable by execution of a conditional branch of the sequence which is determined by at least one of an overflow state of the address control register, a data control value, a pattern counter, and a test mode register compare.

4. The built-in, on-chip, test system according to claim 3, wherein the test sequence branches to an address in a branch control register.

5. The built-in, on-chip system according to claim 3, wherein a microcode instruction can update the branch pointer to point to the current instruction.

6. The built-in, on-chip system according to claim 1, wherein the test mode logic consists of a test mode register, a set of test mode compare latches, and a comparator.

7. The built-in, on-chip system according to claim 6, wherein the test mode register contains a bit that toggles data in and data out, an address ordering bit, two scan order bits, and two address count bits.

8. The built-in, on-chip system according to claim 7, wherein the two scan order bits identify one of three possible address modes.

9. The built-in, on-chip system according to claim 8, wherein one address mode of the three possible address modes is when consecutive test patterns select between cells of the embedded array that are adjacent in a bit direction.

10. The built-in, on-chip system according to claim 8, wherein one address mode of the three possible address modes is when consecutive test patterns operate on cells of the embedded array that are adjacent in a word line direction.

11. The built-in, on-chip system according to claim 8, wherein one address mode of the three possible address modes is when consecutive test patterns operate on different subarrays of the embedded array to test the logic that selects between the subarrays.

12. The built-in, on-chip system according to claim 7, wherein the set of test mode compare latches contains a bit that toggles data in, an address ordering bit, and two scan order bits.

13. The built-in, on-chip, test system according to claim 1, wherein the embedded array is embedded within a VLSI logic chip.

14. A method for testing an embedded array on a processor with a built in self test engine on the processor, the method comprising:
   scanning a test program and data into the built in self test engine wherein the test program includes instructions controlling a test mode register, test mode compare latches, a data expect value element, an address dependent data inverter, a pattern counter, and a branch register;
   executing the test program to test the embedded array;
   scanning a test mode register to control address ordering and data generation;
   comparing an output from the embedded array with an expected data value to determine a result of the test using the on chip built in self test engine.

15. The method of claim 14, wherein the step of scanning information into the built in self test engine comprises loading one or more instruction into one or more instruction registers.

16. The method of claim 14, wherein instructions contain a control bit sent to the test mode register that cause an update of the test-mode register.

17. The method of claim 14, wherein scan initializing, or updating the test mode register cause changes in address control bits in a set of address control registers that change the ordering of access to the embedded array.

18. The method of claim 14, wherein scan initializing, or updating the test mode register cause inversions in the data sent as input to the embedded array and corresponding changes in the data expect value.

19. The method of claim 14, wherein instructions contain a control bit sent to a branch register that cause the branch register to be updated to the current value of a pointer control register.

20. An apparatus for testing an embedded array on a processor with a built in self test engine on the processor, the apparatus comprising:
   a scanning means for scanning a test program and data into the built in self test engine wherein the test program includes instructions controlling a test mode register, test mode compare latches, a data expect value element, an address dependent data inverter, a pattern counter, and a branch register;

an executing means for executing the test program to test the embedded array;

a scanning means for scanning a test mode register to control address ordering and data generation;

a comparing means for comparing an output from the embedded array with an expected data value to determine a result of the test using the on chip built in self test engine.

21. The apparatus of claim 20, wherein the scanning means for scanning information into the built in self test engine comprises loading one or more instructions into one or more instruction registers.

22. The apparatus of claim 20, wherein instructions contain a control bit sent to the test mode register that cause an update of the test mode register.

23. The apparatus of claim 20, wherein scan initializing, or updating the test mode register cause changes in address control bits in a set of address control registers that change the ordering of access to the embedded array.

24. The apparatus of claim 20, wherein scan initializing, or updating the test mode register cause inversions in the data sent as input to the embedded array and corresponding changes in the data expect value.

25. The apparatus of claim 20, wherein instructions contain a control bit sent to a branch register that cause the branch register to be updated to the current value of a pointer control register.

* * * * *